United States Patent [19]

Suarez

[11] Patent Number: 5,132,634

[45] Date of Patent: Jul. 21, 1992

[54] AMPLIFIER CIRCUIT WITH ENVELOPE SMOOTHING

[75] Inventor: Jose L. Suarez, Coral Gables, Fla.

[73] Assignee: Motorola, Inc., Schaumburg, Ill.

[21] Appl. No.: 674,017

[22] Filed: Mar. 25, 1991

[51] Int. Cl.⁵ .............................................. H03G 3/20
[52] U.S. Cl. ............................... 330/129; 330/138;
330/279; 375/98; 455/116; 455/126; 455/127
[58] Field of Search ............... 330/129, 138, 279, 280;
375/98; 455/116, 126, 127, 239, 240, 244

[56] References Cited

U.S. PATENT DOCUMENTS

| 4,592,073 | 5/1986 | Watanabe | 455/126 X |
| 4,706,262 | 11/1987 | Ohta | 455/116 X |
| 4,992,753 | 2/1991 | Jenson et al. | 330/129 |

Primary Examiner—James B. Mullins
Attorney, Agent, or Firm—Daniel K. Nichols; M. Mansour Ghomeshi

[57] ABSTRACT

A closed loop amplifier circuit (100) having an on state (202) and an off state (204) is disclosed. The amplifier circuit (100) includes an Automatic Gain Control (AGC) circuit (116). The AGC circuit (116) controls the rate of change in the output power (120) of the amplifier circuit (100) when it changes from the off state (204) to the on state (202) or vice versa. The amplifier circuit (100) also includes a programming circuit (114) that is coupled to the AGC circuit (116). The programming circuit (114) is used to program a desired rate of change into the AGC circuit (116).

10 Claims, 3 Drawing Sheets

AMPLIFIER CIRCUIT WITH ENVELOPE SMOOTHING

CROSS REFERENCED APPLICATIONS

This application is related to an application entitled "Dynamically Biased Amplifier" by inventor William Martin filed on Dec. 17, 1990 and having Ser. No. 07/628,812.

TECHNICAL FIELD

This invention relates to electronic amplifiers, and more specifically to amplifiers for use in communication devices.

BACKGROUND

Communication devices operating in Time Division Multiplexing (TDM) systems are required to alternate between transmit and receive at high rates. Switching frequencies as high as 1 KHz are common in such applications which requires that the transmitters be on for a period of 1 ms and off for a period of 1 ms. The short on cycle of these transmitters puts stringent requirements on their amplifiers that have to reach full power in a fraction of the transmitter on time. Furthermore, in portable radios operating from battery power, there is a great need for power amplifiers which exhibit high operating efficiencies and low current drain characteristics. This is due to the limited amount of battery capacity available in portable radios, combined with the increasing demands by radio users to operate radios for longer periods of time without recharging the batteries. Since the power amplifiers sued in radios are one of the key current consuming devices of a radio, there is always a need for higher efficiency amplifiers in radio designs.

Unfortunately, high efficiency amplifiers which exhibit fast turn on cycles such as "class B" amplifiers, tend to have problems with what is known as frequency splatter, due to the fact that a Class B amplifier will turn on very quickly (as soon as an input signal to the amplifier is applied which is high enough to bias the amplifier). Tis high speed turn on and off operation of the amplifier causes frequency splatter to be transmitted which is undesired. Frequency splatter not only causes interference with the transmitted signal on nearby channels, but also causes problems in meeting regulator agency requirements (e.g. FCC, etc.) that most countries impose on communication equipments.

An amplifier circuit which can attain high efficiencies, as well as exhibit minimal frequency splatter would be very useful for use in communication equipments, and would be especially useful in TDM applications.

SUMMARY OF THE INVENTION

A closed loop amplifier circuit having an on state and an off state is disclosed. The amplifier circuit includes an Automatic Gain Control (AGC) circuit. The AGC circuit controls the rate of change in the output power of the amplifier when it changes from the off state to the one state or vice versa. The amplifier circuit also includes a programming circuit that is coupled to the AGC circuit. The programming circuit is used to program a desired rate of change in the AGC circuit.

DETAILED DESCRIPTION OF THE PREFERRED EMBODIMENT

Figure 1:
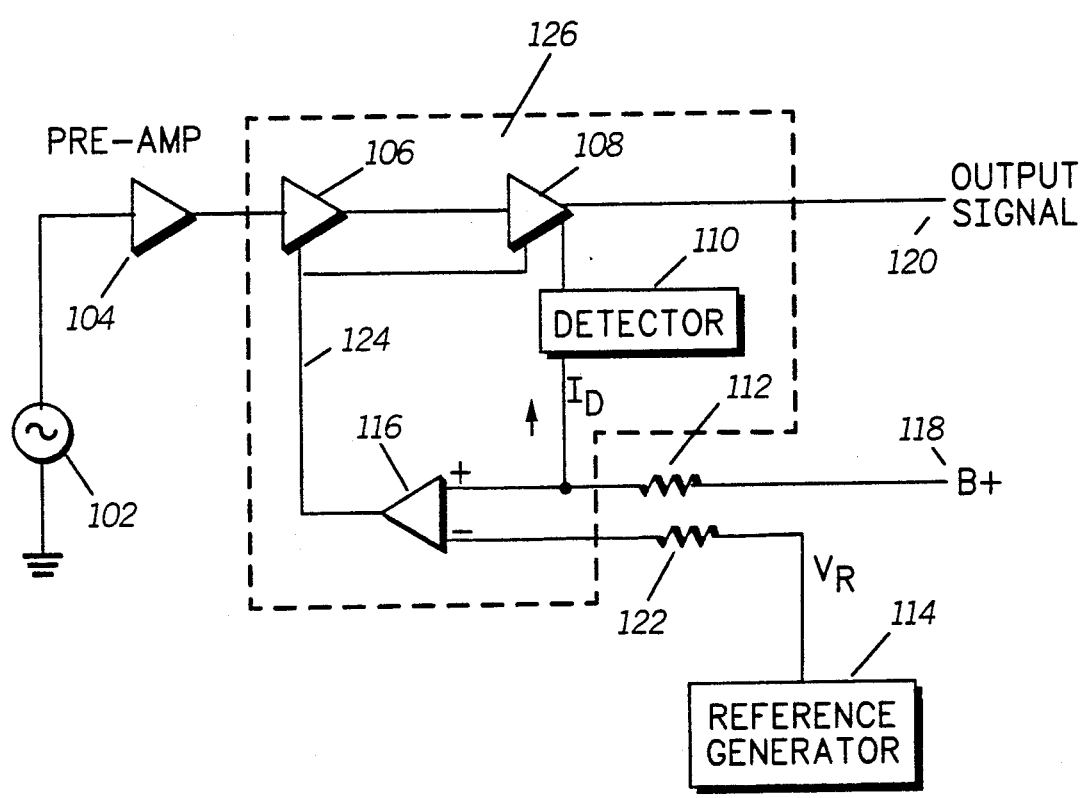
FIG. 1 is a block diagram of an amplifier circuit in accordance with the present invention.

Referring to FIG. 1, a block diagram of an amplifier circuit 100 is shown in accordance with the present invention. The circuit 100 comprises a pre-amplifier stage 104 whose input is connected to the output of a signal generator 102. Preferably, the signal generator 102 produces a Radio Frequency (RF) signal that is to be amplified by the circuit 10 with minimum level of frequency splatter. The output of the pre-amplifier 104 is connected to a second amplifier stage 106 which provides mid-level amplification. The final stage of the circuit 100 is a power amplifier 108 which is connected to the output of the amplifier 106. The power amplifier 108 is a high efficiency amplifier containing "class B" amplifiers. The output of the circuit 100, output signal 120 is the output of the power amplifier 108. It is desirable to minimize the frequency splatter at the output signal 120. In a radio transmitter, the output signal 120 is coupled to an antenna for transmission.

A sample of the output of the power amplifier 108 is applied to a detector 110, whose output is connected to the non-inverting input of a differential amplifier 116. The detector 110 is a converter which monitors the output power level of the power amplifier 108 and produces a relative control signal at its output. In this embodiment, the detector 110 is a power to current converter and its output control signal is in the form of a DC current, $I_D$ which is connected to the non-inverting input of the amplifier 116. In many applications the detector 110 may be includes in the power amplifier 108. This is due to the fact that any accurate detection or conversion of RF power must take place at the source of the RF power. The non-inverting input of the amplifier 116 is also connected to a B+ line via a resistor 112 having a resistance R. The B+ is used to power various active elements of the circuit 100 such as amplifier 106 and 108. To facilitate understanding of the invention, these conventional connects are not shown. The inverting input of the differential amplifier 116 is connected to a reference generator 114 via a resistor 122 having the value R. The reference generator 114 generates a reference signal having a pre-determined format as required by the system. If the output of the reference generator 114 is assumed to be $V_R$, then basically when stable steady state has been reached, the detector current is given by:

$$I_D = (B + - V_R)/R$$

The differential amplifier 116 is preferably an Operational Transconductance Amplifier (OTA). The differential amplifier 116 provides the Automatic Gain Control (AGC) means of the circuit 100. The output of the OTA 116 is connected to the control inputs of amplifier 106 and power amplifier 108 via a control line 124. This control line 124 completes the loop comprising the amplifier 106, the power amplifier 108, the detector 110, and the OTA 116. Hereinafter, this loop will be referred to as loop 126. In steady state condition, this closed loop is stable. When $V_R$, the output voltage of the reference generator 114 is high (about the same as B+ and within the OTA offset voltage) the control line 124 will go to ground, and there is no RF output at the output of the amplifier 108 even when signal is available from the generator 102. If however, $V_R$ is brought down to a desired value at a certain slope the loop 126 follows and the output signal 120 increases. The increase in the output signal 120 is controlled and therefore would have a smooth envelope. In other words, the slope of the output power of the amplifier 108 is controlled by the differential amplifier 116 as it moves from the off state to the on state or vice-versa. Although, no mention has been made of the angle of the slope, it is understood that various system requirements may result in different slopes. Indeed, the slope may not be constant for the duration of the transition from the off state to the on state. Some systems may require partial power to by available at a much faster rate than full power. The programming capabilities of the reference generator provide for this level of flexibility in the control of the slope of the output power as it changes from low levels to high levels, off state to on state, or vice-versa.

The signal generator 102 produces an RF signal at the command of a controller that controls the operation of a device that the circuit 100 is a part of. The RF signal is amplified by the pre-amplifier 104 and applied to the amplifier 106 and subsequently to the power amplifier 108 for further amplification. At start up, in order to avoid the generation of frequency splatter at the output of the power amplifier 108, the loop 126 takes control of the gain of the amplifiers 106 and 108. Using a Digital to Analog Converter (DAC) as part of the reference generator 114, the gain of the two amplifiers 106 and 108 can be digitally controlled to minimize frequency splatter at the output of the amplifier 108. With the use of a DAC, programmed by the same controller that controls the operation of the device that the circuit 100 is a part of, the reference signal applied to resistor 122 increases (or decreases) gradually and at various rates as determined suitable for a particular application. The gradual increase in the set point of the OTA 116 causes the control signal 124 to gradually increase (or decrease). Since the control signal 124 is the feedback to the power amplifier 108, its gradual increase (or decrease) results in the output signal 120 having a smooth envelope.

Figure 2A:
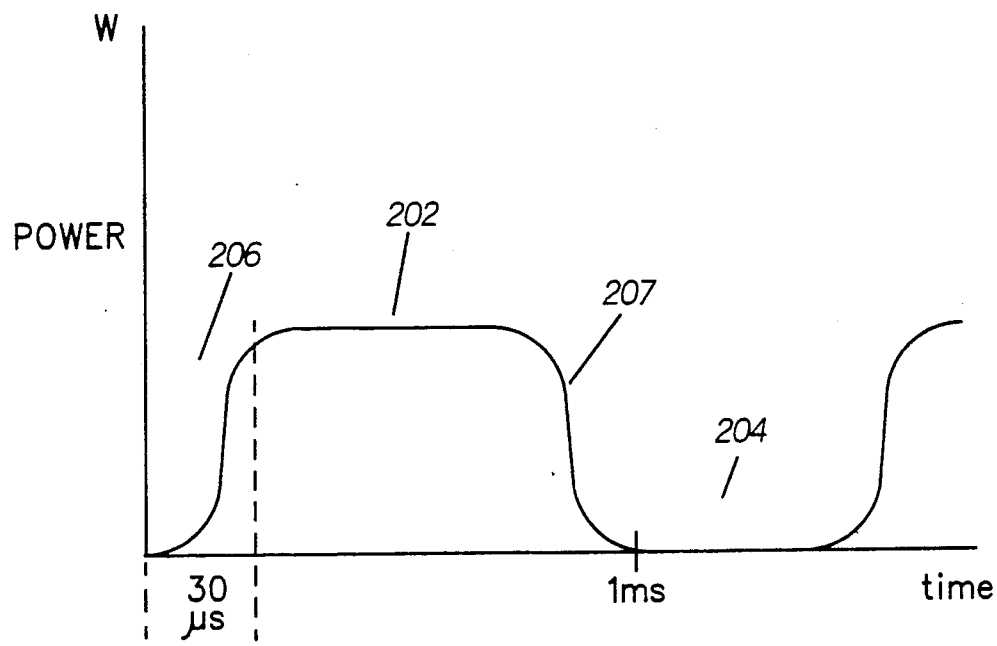
FIG. 2A and 2B are timing diagrams of the amplifier of FIG. 1 in accordance with the present invention.
Figure 2B:
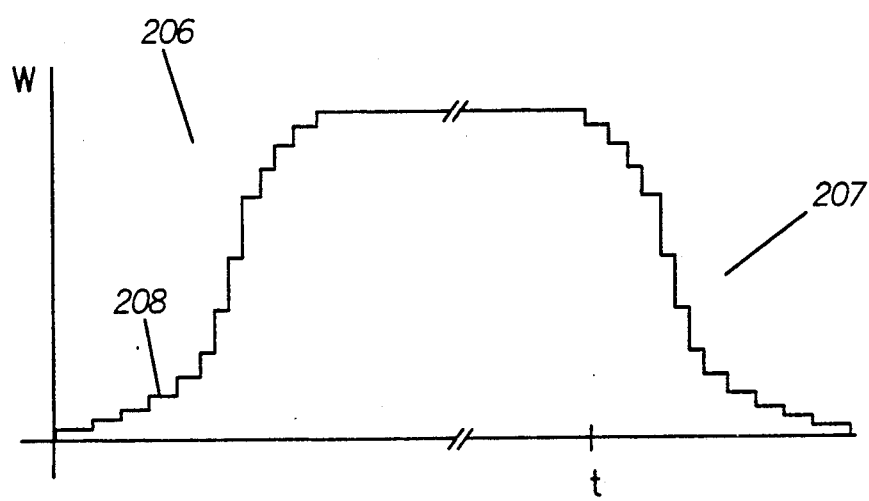

Referring to FIGS. 2A and 2B, timing diagrams of the circuit 100 are shown in accordance with the present invention. FIG. 2A shows the activity of the output signal 120. The horizontal and vertical axis represents time and power level respectively. Periods 202 and 204 represent the presence and absence of signals respectively. In many Time Division Multiplexing (TDM) applications, the duration of periods 202 and 204 are equal. In this embodiment this duration is assumed to be equal and to be 1 ms. During the initial portion 206 (rise time) and the final portion 207 (fall time) of the period 202, the power amplifier 108 must amplify the signal generated by the generator 102. Sine the power amplifier 108 is inactive during the period immediately preceding 202, it is necessary for it to turn on and reach full power. This turn on period can not be longer than a fraction of the period 202 for most of the period 202 is dedicated to the actual data that must be amplified by the circuit 100. The slope with which the output power of the amplifier 108 reaches full power is shown by 206 and not to scale. The duration of 206 and 207 must be carefully calculated to result in minimum frequency splatter and maximum channel throughput. This is done by determining the most time the amplifier 108 can take to power up without sacrificing the efficiency of the transmission channel. In this embodiment 30 $\mu$S is determined to be the appropriate duration for 206 and 207.

Referring now to FIG. 2B, the period 202 is shown on a wider scale to better demonstrate the operation of the circuit 100 at turn on and turn off. The timing diagram of FIG. 2B assumes that a Digital to Analog Converter (DAC) is used as the reference generator 114. With the DAC 114, the reference for the OTA 116 is controlled via the same controller that controls the signal generator 102 and has command over the entire circuit 100. The digital code at the input of the DAC 114 is varied at a predetermined rate as required by the system. This change is converted to analog levels that are used by the OTA 116 to direct the gain of the amplifiers 106 and 108. The result is the generation of a step function having steps 208 at the reference input of the OTA 116. This step function is introduced to the amplifiers 106 and 108 via the control signal 124. As the amplifiers 106 and 108 respond to the control signal 124, the detector 110 feeds back the information to the OTA 116 closing the loop. Note that the amplitude and the duration of the steps 208 are shown to be identical. However, as mentioned earlier, with the use of the DAC 114 these steps could be programmed to have varying durations and/or amplitudes as required by the system. Loop 126 must be fast in order to respond adequately to steps 208, essentially reaching temporary steady state before next step.

In summary, a circuit 100 is described that uses an OTA 116 as an AGC to produce a feed back loop 126. The loop 126 further comprises an amplifier 106, a detector 110, and a power amplifier 108. The circuit 100 is used to minimize the level of frequency splatter that is generated by the power amplifier 108 as it transitions from an off state to an on state. The reference input to the OTA 116 is provided via a reference generator 114, namely a Digital to Analog Converter (DAC). The detector 110 produces a DC current level $I_D$ in response to the detected power level at the output of the power amplifier 108. The $I_D$ is compared to $V_R$, the output of the DAC 114, via the OTA 116. With this comparison the OTA 116 determines if more (less) power is needed at the output. This determination results in the control signal 124 directing the power amplifier 108 to produce more (less) power.

Figure 3:
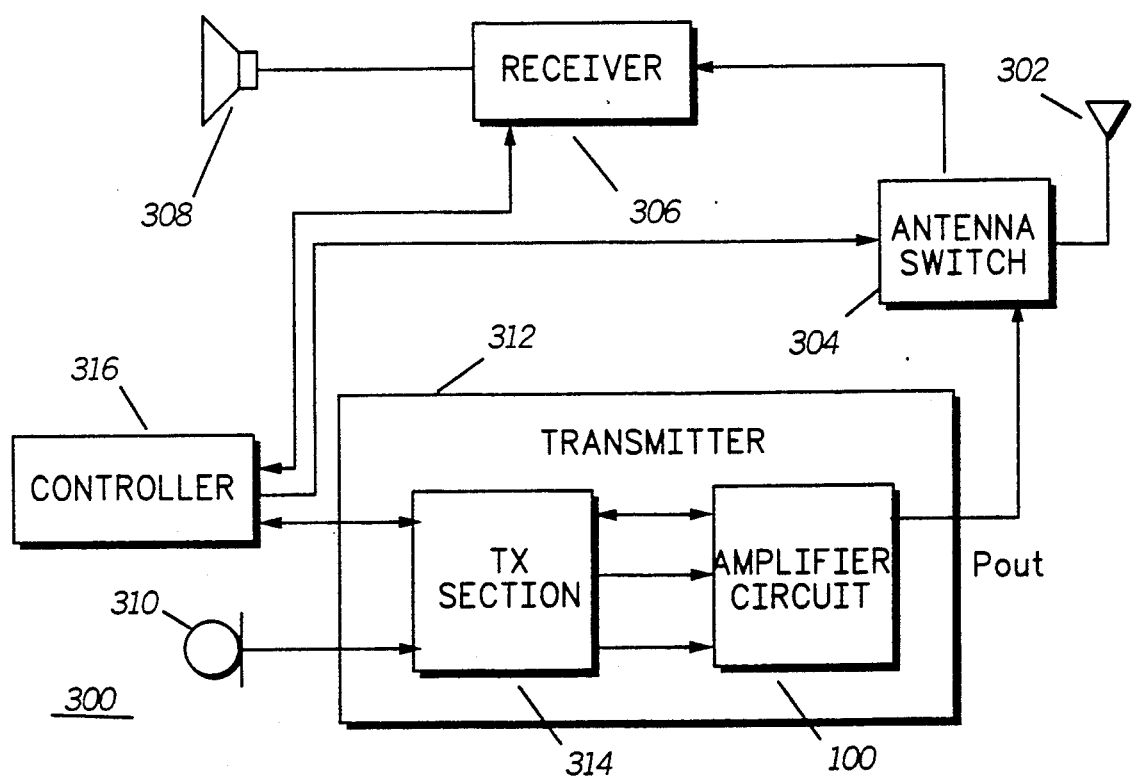
FIG. 3 a block diagram of a radio in accordance with the present invention.

In FIG. 3, a radio 300 is shown. Preferably radio 300 is a time division multiplexed radio that transmits and received at a pre-determined rate as similar to those known in the art. Radio 300 comprises a receiver 306 used for receiving information signals, and a transmitter 312, used to transmit information. Transmitter 312 comprises the amplifier circuit 100 as discussed above, also part of transmitter 312 is section 314 which is the balance of the circuitry which makes up convention RF transmitter 312. Both receiver 306 and transmitter 312 are selectively coupled to antenna 302 via an antenna switch 304. A speaker 308 is connected to receiver 306 for presentation of audio signals received by receiver 306. Microphone 310 is connected to transmitter 312, and allows voice messages to be transmitted via transmitter 312. Radio 300 is also capable of data transmissions, the method of transmission (voice/data) being dependent on the application the radio 300 is used for.

Controller or control means 316 is coupled to the receiver 306, the transmitter 312, and the antenna switch 304. In a TDM radio, like radio 300, the controller 316 controls when the radio receives and transmits. The earlier is followed by the antenna switch 304 being coupled to the input of the receiver 306. In the transmit mode the output of the transmitter 312 is coupled to the antenna switch 304. For the purposes of the present invention, controller 316 controls the on and off cycles of the signal generator 102. The controller 316 also provides the digital code for the DAC 114 via which the loop 126 controls the gain of the amplifiers 106 and 108. By knowing exactly when the radio 300 is transmitting and receiving, the controller 118 decides when to apply a series of pre-determined digital codes to the DAC 114 for the desired results the control signal 124. In other words the controller 316 programs the DAC 114 to control the transition of the transmitter 312 from the off state to the on state, and vice-versa.

As can be seen by one skilled in the art the present invention solves the problems that low current drain amplifier designs (e.g. class, B,C, or E amplifiers, etc.) have with frequency splatter due to the rapid turn on and off of the amplifiers. With the use of a DAC coupled to an AGC the slope of the increase or decrease in the output power is controlled. This control is particularly useful in Time Domain Multiplexing devices where their transmitters are turned on and off at high rates.

While the present invention has been described with specific embodiments, it is evident that many alternatives, modifications, and variation will be apparent to those skilled in the art in light of the foregoing description. Accordingly, it is intended that the present invention embrace all such alternatives, modifications, and variations as fall within the spirit and scope of the appended claims.

What is claimed is:

1. A Radio Frequency (RF) amplifier circuit for amplifying a signal available at its input to produce a signal having a smooth envelope at its output, the amplifier comprising:
    an amplifier means having a feed back loop;
    a transconductance amplifier coupled in the feedback loop of the amplifier means for controlling the gain of the amplifier means as the output power of the amplifier means increases from a low power level to a high power level, the transconductance amplifier having a signal input and a reference input;
    a power to current converter coupled to the signal input of the transconductance amplifier for detecting the power level at the output of the amplifier means and producing a relative current based on the detected output power; and
    a current generator coupled to the reference input of the transconductance amplifier for generating a reference signal having a pre-determined format for controlling the envelope of the RF signal as the output power increases from the low power level to the high power level.

2. The amplifier circuit of claim 1, wherein the transconductance amplifier further includes means for controlling the gain of the amplifier means as the output power of the amplifier means decreases form a high power level to a low power level.

3. The amplifier circuit of claim 1, wherein the amplifier means comprises a multi-stage amplifier.

4. The amplifier circuit of claim 1, wherein the current generator comprises a Digital to Analog Converter (DAC).

5. A spectrum efficient Radio Frequency (RF) amplifier circuit, comprising:
    an amplifier means having an on state and an off state and adapted for amplifying RF signals;
    a power to current converter coupled to the output of the amplifier means for converting the output RF power level into a relative current;
    a transconductance amplifier having a first and a second input and an output, wherein the first input is coupled to the power to current converter and the output is coupled to the amplifier means, the transconductance amplifier adapted for controlling the slope of the output power of the amplifier means as it moves from the off state to the on state; and
    a current generator reference means coupled to the second input of the transconductance amplifier for providing a reference slope for the output power of the amplifier means to follow.

6. The amplifier circuit of claim 5 wherein the amplifier means includes a pre-amplifier stage.

7. The amplifier circuit of claim 5 wherein the amplifier means is inclusive of the power to current converter.

8. A Time-Division Multiplexed (TDM) transmitter adapted for transmitting a Radio Frequency (RF) signal having a pre-determined duration, the transmitter comprising:
    amplifier means for amplifying RF signals, the amplifier including gain control means for switching from an off state and an on state following a pre-determined format;
    a power to current converter coupled to the amplifier means for converting the output power level into a relative current;
    a current generator means for generating a reference signal with a pre-determined format; and
    a transconductance amplifier having a plurality of inputs and an output, the inputs coupled to the current generator means and the power to current converter, the output coupled to the amplifier means for directing the output power of the amplifier means to follow the pre-determined format of the current generator means when switching from the off state to the on state.

9. The transmitter of claim 8, further including a controller means for controlling the timing of the amplifier means.

10. The transmitter of claim 8, wherein current generator means comprises a Digital to Analog Converter (DAC) means for adjusting the gain of the transconductance amplifier in digital steps.

* * * * *